(12) United States Patent
Geisberger (10) Patent No.: US 9,745,189 B1
(45) Date of Patent: Aug. 29, 2017

(54) MEMS DEVICE WITH ISOLATION SUB-FRAME STRUCTURE

(71) Applicant: NXP USA, Inc., Austin, TX (US)

(72) Inventor: Aaron A. Geisberger, Austin, TX (US)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 15/497,741

(22) Filed: Apr. 26, 2017

Related U.S. Application Data

(62) Division of application No. 14/935,863, filed on Nov. 9, 2015, now Pat. No. 9,663,348.

(51) Int. Cl.
 *H01L 21/00* (2006.01)
 *B81C 1/00* (2006.01)

(52) U.S. Cl.
 CPC ................. *B81C 1/00626* (2013.01)

(58) Field of Classification Search
 USPC ........................................... 438/52; 257/418
 See application file for complete search history.

(56) References Cited

U.S. PATENT DOCUMENTS

| | | | | |
|---|---|---|---|---|
| 6,770,506 B2* | 8/2004 | Gogoi | ............... | B81C 1/00626 216/2 |
| 8,919,199 B2* | 12/2014 | Judy | ............... | G01C 19/5684 73/504.12 |
| 8,925,384 B2* | 1/2015 | McNeil | ............... | G01P 15/125 73/504.12 |
| 9,221,674 B1* | 12/2015 | Liu | ............... | B81B 7/007 |
| 9,403,673 B2* | 8/2016 | Liu | ............... | B81B 7/007 |
| 2004/0121506 A1* | 6/2004 | Gogoi | ............... | B81C 1/00626 438/52 |
| 2012/0137773 A1* | 6/2012 | Judy | ............... | G01C 19/5684 73/504.12 |
| 2013/0319117 A1* | 12/2013 | McNeil | ............... | G01P 15/125 73/514.32 |
| 2016/0031703 A1* | 2/2016 | Liu | ............... | B81B 7/007 257/418 |

* cited by examiner

*Primary Examiner* — Telly Green (57) ABSTRACT

An embodiment of a microelectromechanical systems (MEMS) device is provided, which includes a substrate; a proof mass positioned in space above a surface of the substrate, wherein the proof mass is configured to pivot on a rotational axis parallel to the substrate; an anchor structure that includes two or more separated anchors mounted to the surface of the substrate, wherein the anchor structure is aligned with the rotational axis; and an isolation sub-frame structure that surrounds the anchor structure and is flexibly connected to each of the two or more separated anchors of the anchor structure, where the proof mass is flexibly connected to the isolation sub-frame structure.

14 Claims, 9 Drawing Sheets

DEPOSIT DIELECTRIC LAYER 310 OVER SUBSTRATE 305
1105

FIG. 12

DEPOSIT CONDUCTIVE LAYER 1205 OVER DIELECTRIC LAYER 310; PATTERN AND ETCH CONDUCTIVE LAYER 1205 TO FORM SENSE ELECTRODES 230, ROUTING, AND OTHER CIRCUITRY
1110

FIG. 13

(OPTIONAL) DEPOSIT NITRIDE LAYER 1305 OVER REMAINING CONDUCTIVE LAYER 1205 AND EXPOSED DIELECTRIC LAYER 310; PATTERN AND ETCH NITRIDE LAYER 1305 TO REMAIN OVER EXPOSED DIELECTRIC LAYER 310
1115

FIG. 14

DEPOSIT SACRIFICIAL LAYER 1405 OVER SUBSTRATE 305, INCLUDING OVER REMAINING CONDUCTIVE LAYER 1205; PATTERN AND ETCH SACRIFICIAL LAYER 1405 TO FORM OPENINGS 1410 FOR ANCHORS
1120

FIG. 17

MEMS DEVICE WITH ISOLATION SUB-FRAME STRUCTURE

CROSS-REFERENCE TO RELATED APPLICATIONS

This application is a divisional of U.S. patent application Ser. No. 14/935,863 having a filing date of Nov. 9, 2015, common inventors, common assignee, which is incorporated by reference in its entirety.

BACKGROUND

Field

This disclosure relates generally to microelectromechanical systems (MEMS), and more specifically, to a MEMS device having a sub-frame structure for stress isolation.

Related Art

Microelectromechanical systems (MEMS) devices are widely used in applications such as automotive, inertial guidance systems, household appliances, protection systems for a variety of devices, and many other industrial, scientific, and engineering systems. Such MEMS devices maybe used to sense a physical condition such as acceleration, angular velocity, pressure, or temperature, and to provide an electrical signal representative of the sensed physical condition. MEMS sensor designs are highly desirable for operation in high gravity environments and in miniaturized devices, and due to their relatively low cost.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale and do not necessarily indicate correct proportions.

DETAILED DESCRIPTION

The following sets forth a detailed description of various embodiments intended to be illustrative of the invention and should not be taken to be limiting.

Overview

One particular type of microelectromechanical systems (MEMS) device that is used in a variety of applications is an accelerometer. MEMS devices are sometimes operated in low pressure environments, such as in gyroscope applications where a MEMS accelerometer may be included as part of a combination device and placed in the same low pressure cavity as the gyroscope. Typically, a MEMS accelerometer includes (among other component parts) a movable element, also referred to as a proof mass. The proof mass is resiliently suspended above a substrate by one or more compliant torsion springs. When the MEMS accelerometer experiences acceleration in a z-direction substantially perpendicular to the proof mass, the torsion springs enable movement of the proof mass around a rotational axis that is parallel to the substrate. Generally, a pair of electrodes are located on a surface of the substrate, one on either side of the rotational axis, underneath the proof mass. As the proof mass rotates about the rotational axis, the proof mass moves closer to one of the pair of electrodes and father from the other electrode, altering the capacitances between the proof mass and the pair of electrodes. In this manner, the motion of the proof mass may then be converted into an electrical signal having a parameter magnitude (e.g., voltage, current, frequency, etc.) that is proportional to the acceleration in the z-direction.

Often a central anchor point can be used to connect the proof mass to the substrate. However, the substrate may experience package stress that causes substrate curvature (e.g., substrate "bowls" up), which affects the distance, or sense gap, between the proof mass and the electrodes. Changes in the sense gap causes a change in sensitivity of the accelerometer (e.g., the accelerometer may falsely sense acceleration when the curvature raises an electrode closer to the proof mass, shrinking the sense gap between the proof mass and the electrode). To compensate for the substrate curvature, it becomes advantageous to have two anchor points moved out from the center of the proof mass along the rotational axis (as shown in FIG. 1), where the spaced anchor points experience similar effects from the substrate curvature as the electrodes (e.g., the anchor points may be similarly raised due to the curvature, maintaining the original sense gap or as close to the original sense gap as possible between the proof mass and electrodes).

Figure 1:
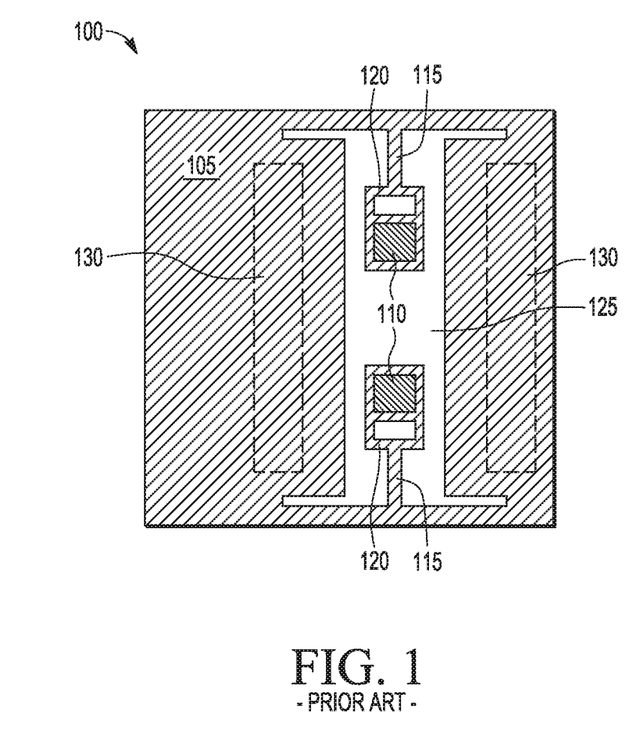
FIG. 1 illustrates a top-down view diagram depicting a prior art anchor structure of a MEMS device.

FIG. 1 illustrates an example MEMS device 100 that represents a typical single axis "teeter-totter" style accelerometer including one type of prior art anchor structure. MEMS device 100 includes proof mass 105, anchors 110, torsion springs 115, compliant members 120, and electrodes 130. Proof mass 105 is suspended above an underlying substrate of MEMS device (also referred to as a device substrate) via anchors 110, compliant members 120, and torsion springs 115. Anchors 110, compliant members 120, and torsion springs 115 are separated from proof mass 105 by one or more openings 125, which allow proof mass 105 to move about a rotational axis centered through torsion springs 115 (e.g., in the y-direction). Electrodes 130 are attached to the device substrate and underlie proof mass 105 on either side of a rotational axis centered through torsion springs 115.

The prior art anchor structure includes two separated anchors 110 attached to the device substrate that are located along the rotational axis, spaced away from the center of proof mass 105. The anchors 110 are separated in an effort to minimize the change in the sense gap between proof mass 105 and underlying electrodes 130 caused by substrate curvature (e.g., in the z-direction perpendicular to the page). Although the separated placement of anchors 110 may improve sensitivity of MEMS device 100, the separated anchors 110 are affected by strain buildup in the y-direction caused by substrate curvature deforming the anchors from their original zero strain position (e.g., the anchors may flex or "pull" away from torsion springs 115 and proof mass 105). The prior art anchor structure also includes compliant members 120 connected between anchors 110 and torsion springs 115, which provide flexibility in an attempt to mitigate strain buildup in the y-direction. However, the prior art anchor structure with separated anchors 110 and compliant members 120 does not isolate torsion springs 115 or proof mass 105 from in-plane motions that arise due to the strain caused by substrate curvature. For example, during substrate bending, the y-axis strain buildup or deformation may cause the anchors to move non-uniformly (e.g., the anchors may laterally shift along the y-direction), causing in-plane relative movement that is propagated via compliant members 120 to torsion springs 115 and proof mass 105. Such in-plane anchor motions can affect the stiffness of torsion springs 115, as well as impose bending on proof mass 105.

The present disclosure provides an isolation sub-frame structure for an anchor structure having separated anchor points that improves stress isolation for a MEMS device. The isolation sub-frame structure surrounds the separated anchor points and is connected to each anchor point by compliant connections that provide flexibility to compensate for deformation of the anchor points arising from strain buildup caused by substrate curvature. The isolation sub-frame structure also isolates the torsion springs and proof mass of the MEMS device from in-plane motions caused by strain buildup between the separated anchor points due to substrate curvature, where such in-plane motions would otherwise impose stress or deformation on torsion springs and proof mass of the MEMS device. The embodiments provided herein are especially beneficial in the fabrication of MEMS devices having high aspect ratios, such as a depth to width ratio of 10 to 1.

Example Embodiments

Figure 2:
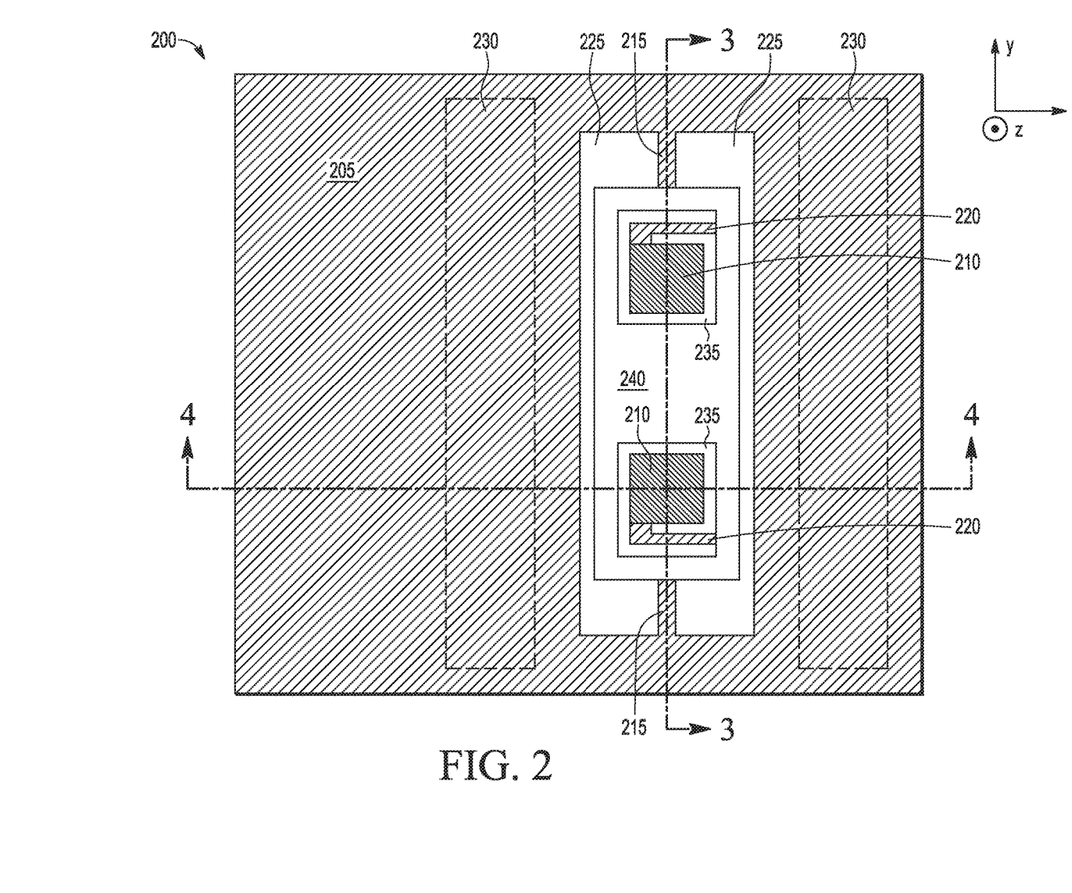
FIG. 2-4 illustrate block diagrams depicting an example isolation sub-frame structure for an example anchor structure of a MEMS device in which the disclosure is implemented, according to some embodiments.

FIG. 2 illustrates a top-down view diagram depicting an example isolation sub-frame structure for an example anchor structure of a MEMS device 200 in which the disclosure is implemented. MEMS device 200 includes proof mass 205, anchors 210, torsion springs 215, compliant structures 220, electrodes 230, and isolation sub-frame structure 240. Proof mass 205 is a moveable structure suspended above an underlying substrate of MEMS device (also referred to as a device substrate) via anchors 210, compliant structures 220, isolation sub-frame structure 240, and torsion springs 215. Torsion springs 215, isolation sub-frame structure 240, and compliant structures 220 are located interior to proof mass 205 and formed from the same material that is used to form proof mass 205, as further discussed below in connection with FIG. 11-17. Anchors 210, compliant structures 220, and isolation sub-frame structure 240 are separated from one another by one or more openings 235. Isolation sub-frame structure 240 and torsion springs 215 are separated from proof mass 205 by one or more openings 225. Electrodes 230 are attached or mounted to the device substrate and underlie proof mass 205 on either side of a rotational axis of MEMS device 200.

Proof mass 205 is connected to torsion springs 215 and is able to move or pivot about a rotational axis centered through torsion springs 215 (e.g. in the y-direction) and parallel to the device substrate, where broken line 3 also illustrates such a rotational axis. An example orientation of x-, y-, and z-axes are illustrated in FIG. 2, which is similarly utilized throughout the figures herein. Movement of proof mass 205 alters capacitances between proof mass 205 and electrodes 230, and these capacitances are utilized to determine acceleration in a z-direction. Electrodes 230 may include fixed or movable electrodes, sense electrodes, actuator electrodes, and the like. Other types of electrodes may also be implemented as part of MEMS device 200, such as electrodes that measure lateral acceleration (e.g., in an x-direction, in a y-direction, or both).

In the embodiment illustrated, the anchor structure of MEMS device 200 includes two separated anchors 210 attached or mounted to the device substrate that are aligned with the rotational axis, located away from the center of proof mass 205. Anchors 210 are separated from one another in an effort to minimize the change in the sense gap between proof mass 205 and underlying electrodes 230 caused by substrate curvature (e.g., in the z-direction). A portion of each anchor 210 is located interior to isolation sub-frame structure 240, where isolation sub-frame structure 240 surrounds both anchors 210. Each anchor 210 is connected to isolation sub-frame structure 240 by a compliant structure 220. One end of each compliant structure 220 is connected to a portion of a respective anchor 210 and the other end of each compliant structure 220 is connected to an interior portion of isolation sub-frame structure 240. In the embodiment shown, each anchor 210 is surrounded by a single opening 235 that generally spirals outward, although a different number of openings 235 and differently shaped openings 235 (which form differently shaped compliant structures 220) may be used in other embodiments. Compliant structures 220 provide flexibility to compensate for deformation of the anchors arising from strain buildup caused by substrate curvature. The amount of flexibility provided by compliant structures 220 depends upon characteristics of the compliant structure 220, such as length of the compliant structure measured from a connection point at anchor 210 to a connection point at isolation sub-frame structure 240, as well as the width of compliant structure (e.g., a width of compliant structure 220 measured in the y-direction in FIG. 3).

Isolation sub-frame structure 240 is connected between torsion springs 215, where an exterior portion of an end of isolation sub-frame structure 240 is connected to a respective torsion spring 215. Isolation sub-frame structure 240 provides additional stiffness to isolate torsion springs 215 and proof mass 205 from in-plane movement (e.g., in the y-plane) arising from strain buildup or deformation of anchors 210 due to substrate curvature. For example, any non-uniform movement by the anchors due to substrate curvature is distributed to isolation sub-frame structure 240, which has enough stiffness to minimize the transfer of such movement to torsion springs 215 and proof mass 205. In other words, isolation sub-frame structure 240 constrains lateral movement (e.g., flexing in the y-direction) of the anchors 210 from being propagated to torsion springs 215 and proof mass 205. Cross-sectional views of the isolation sub-frame structure 240 are illustrated in FIG. 3 (along broken line 3) and FIG. 4 (along broken line 4).

It is noted that the isolation sub-frame structure has a mirrored design in the embodiments shown (e.g., one end of the isolation sub-frame structure is a mirrored version of the other end), although the isolation sub-frame structure may have other designs in other embodiments (e.g., symmetrical, asymmetrical, free form, and the like). It is also noted that the layout of the compliant structures attached to the anchors are mirrored in the embodiments shown (e.g., the compliant structures attached to anchors in one end of the isolation sub-frame structure is a mirrored version of the compliant structure layout in the other end), although other layouts may be used in other embodiments (e.g., the compliant structure layouts may be rotated versions of one another such as rotated by 90 or 180 degrees, symmetrical, asymmetrical, free form, and the like). It is also noted that symmetrical designs are preferred for simplicity of MEMS device layout and fabrication. It is also noted that although the anchors, compliant structures, isolation sub-frame structure, torsion springs, and proof mass are illustrated in the figures with different cross-hatching to aid in distinguishing such components from one another in the following figures, all of such components are formed from a same material (e.g., polysilicon) in some embodiments.

It is noted that the MEMS devices discussed herein in connection with the figures may be characterized as a MEMS sensor that is included in any number of devices utilized in various systems, including but not limited to automotive systems, household appliances, protection systems, and the like. It is noted that the MEMS devices discussed herein in connection with the figures are shown in simplified form for ease of understanding. As such, the MEMS devices may include a number of other structures and components that are not shown in the figures, such as having a number of anchors, torsion springs, compliant structures, openings, and electrodes different from the embodiments illustrated. For example, additional torsion springs may connect the anchor to the proof mass in a direction perpendicular to the illustrated torsion springs to create a second axis of rotation (e.g., one rotational axis along the y-direction and a perpendicular rotational axis along the x-direction of the plane of the proof mass' surface), allowing the MEMS device to rotate on both an x-axis and a y-axis. Such an embodiment may also include additional electrodes that measure acceleration of the proof mass in different directions. Additional anchors may be provided in other embodiments, where such additional anchors may be aligned along the rotational axis itself or aligned along a line parallel to, and offset from, the rotational axis. It is noted that the isolation sub-frame structure may also be characterized as being part of an isolation anchor structure that also includes anchors and compliant structures.

Figure 3:
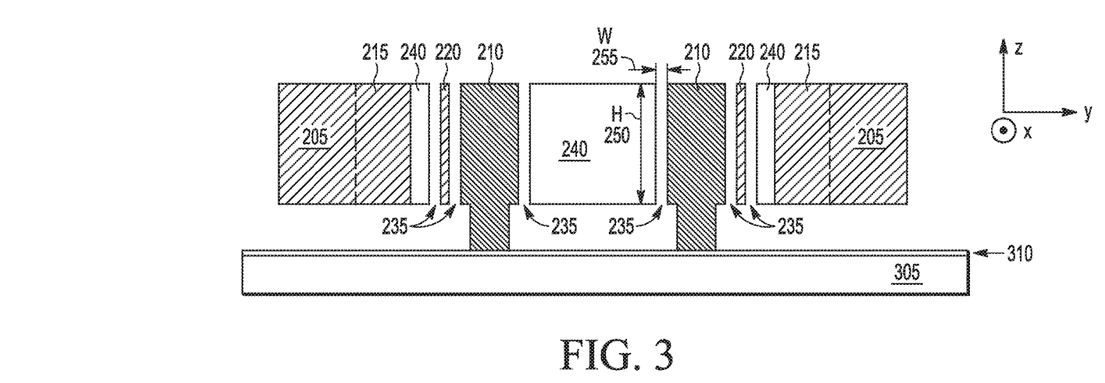

FIG. 3 illustrates a cross-sectional view diagram depicting the isolation anchor structure including isolation sub-frame structure 240 of MEMS device 200 of FIG. 2. The cross-sectional view of FIG. 3 is in a plane through the rotational axis in the y-direction, as defined by torsion springs 215. Device substrate 305 is covered with a dielectric layer 310 that insulates MEMS device 200 from any underlying circuitry. Anchors 210 are attached or mounted to the top surface of dielectric layer 310, which are spaced from one another in the y-direction. One or more openings 235 separate anchor 210 from isolation sub-frame structure 240, anchor 210 from compliant structure 220, and compliant structure 220 from isolation sub-frame structure 240. Isolation sub-frame structure 240 is connected to torsion springs 215 on either end. Torsion springs 215 are connected to proof mass 205, where an interior edge of proof mass 205 (formed by opening 225) is shown as a dashed line.

It is noted that the present disclosure is beneficial in MEMS devices that implement a high aspect ratio, as indicated by the openings 235 having a much greater height H 250 (and structures 205, 215, 220, and 240 having a greater thickness) as compared to width W 255 (e.g., 10 to 1 ratio). An example high aspect ratio thickness or height H 250 includes 25 microns. By comparison, a traditional thickness or height H 250 (without high aspect ratio) includes 3 microns. The large thickness of the material (e.g., polysilicon) used to form the structures of a MEMS device (like MEMS device 200) provides greater strength for the MEMS device, improving durability of the device. Wider portions of the material (such as isolation sub-frame structure 240) have enough stiffness to absorb in-plane motions, while thinner portions of the material (such as compliant structures 220) have enough flexibility to compensate for strain buildup due to substrate curvature.

Figure 4:
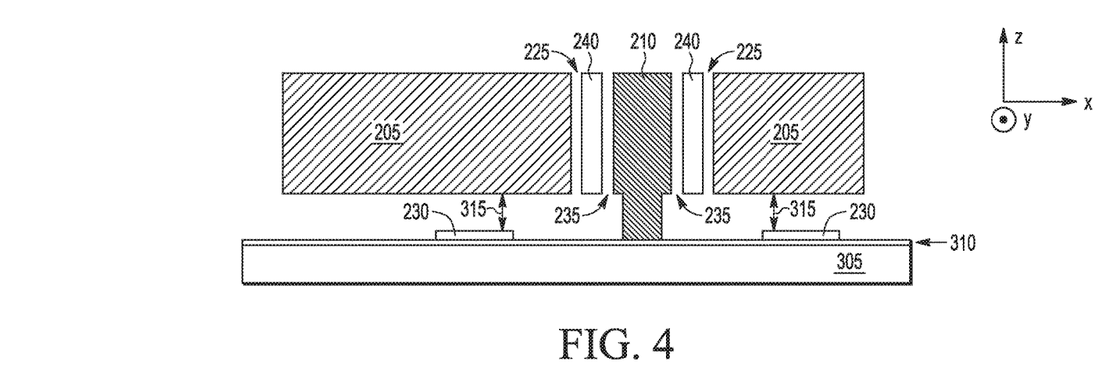

FIG. 4 illustrates a cross-sectional view diagram depicting the isolation anchor structure including isolation sub-frame structure 240 of MEMS device 200 of FIG. 2. The cross-sectional view of FIG. 4 is in a plane perpendicular to the rotational axis defined by torsion springs 215. Electrodes 230 are attached to the top surface of dielectric layer 310. In some embodiments, electrodes 230 are connected to other circuitry (not shown for ease of illustration). Anchors 210 are separated from isolation sub-frame structure 240 by openings 235. Isolation sub-frame structure 240 is separated from proof mass 205 by openings 225. Proof mass 205 is able to pivot around the rotational axis that is centered through anchor 210 (e.g., y-direction into the page), which is aligned with torsion springs 215 of MEMS device 200. Each electrode 230 is separated from proof mass 205 by a sense gap, where capacitances between electrodes 230 and proof mass 205 generally indicate acceleration.

Figure 5:
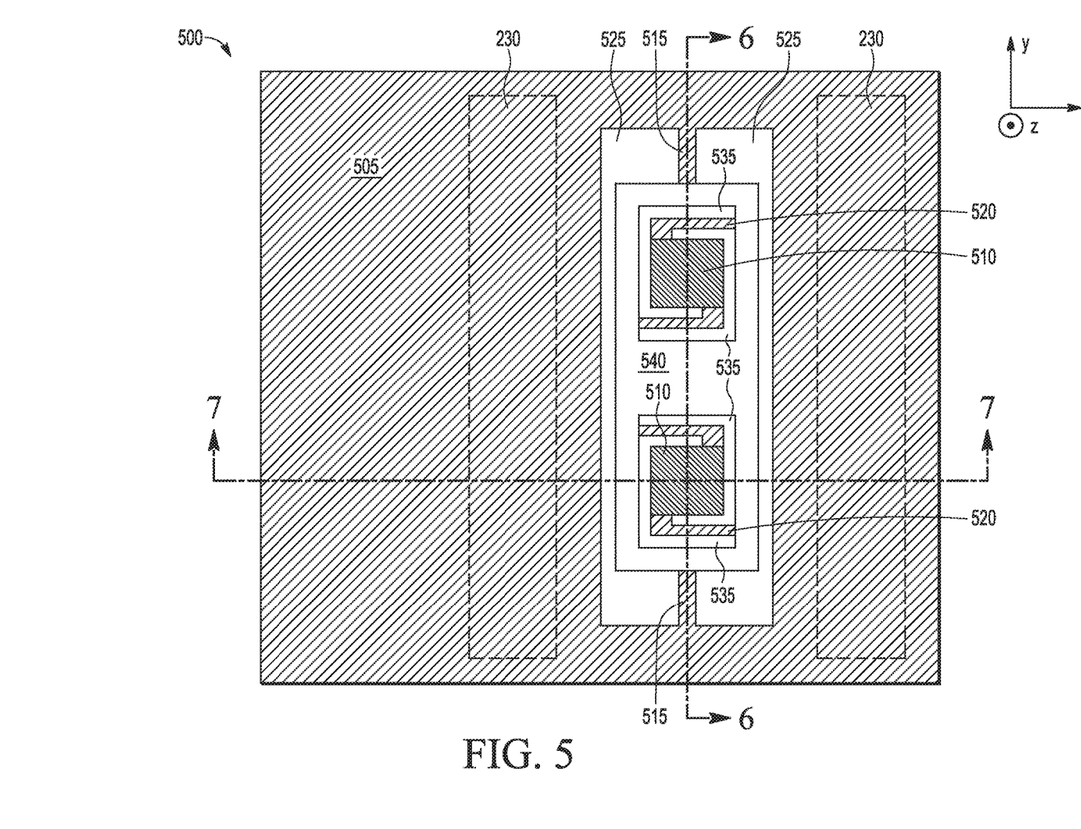
FIG. 5-7 illustrate block diagrams depicting another example isolation sub-frame structure for an example anchor structure of a MEMS device in which the disclosure is implemented, according to some embodiments.

FIG. 5 illustrates a top-down view diagram depicting another example isolation sub-frame structure for an example anchor structure of a MEMS device 500 in which the disclosure is implemented. Proof mass 505 is suspended above an underlying substrate of MEMS device (also referred to as a device substrate) via anchors 510, compliant structures 520, isolation sub-frame structure 540, and torsion springs 515. Anchors 510, compliant structures 520, and isolation sub-frame structure 540 are separated from one another by openings 535. Isolation sub-frame structure 540 and torsion springs 515 are separated from proof mass 505 by openings 525, where isolation sub-frame structure 540, torsion springs 515, and compliant structures 520 are located interior to proof mass 505. Electrodes 230 (like those discussed above in connection with FIG. 2-4) are attached to the device substrate and underlie proof mass 505 on either side of the rotational axis centered through torsion springs 515 (e.g., in the y-direction) and parallel to the device substrate, where broken line 6 also illustrates such a rotational axis.

In the embodiment illustrated, the anchor structure of MEMS device 500 includes two separated anchors 510 attached to the device substrate. Anchors 510 of the anchor structure are aligned with the rotational axis and located away from the center of proof mass 505. Isolation sub-frame structure 540 surrounds both anchors 510, with a portion of each anchor 510 being located interior to isolation sub-frame structure 540. Each anchor 510 is connected to isolation sub-frame structure 540 by a pair of compliant structures 520, although a different number of compliant structures may be connected in other embodiments. One end of each compliant structure 520 is connected to a portion of a respective anchor 510 and the other end of each compliant structure 520 is connected to an interior portion of isolation sub-frame structure 540. In the embodiment shown, paired compliant structures 520 are attached to opposing sides of each anchor 510, although the paired compliant structures 520 may be differently attached to each anchor 510 in other embodiments. In the embodiment shown, each anchor 510 is surrounded by a pair of openings 535 that generally spiral outward, although a different number of openings 535 and differently shaped openings 535 (which form differently shaped compliant structures 520) may be used in other embodiments. Isolation sub-frame structure 540 is connected between torsion springs 515, where an exterior portion of an end of isolation sub-frame structure 540 is connected to a respective torsion spring 515. Cross-sectional views of the isolation sub-frame structure 540 are illustrated in FIG. 6 (along broken line 6) and FIG. 7 (along broken line 7).

Figure 6:
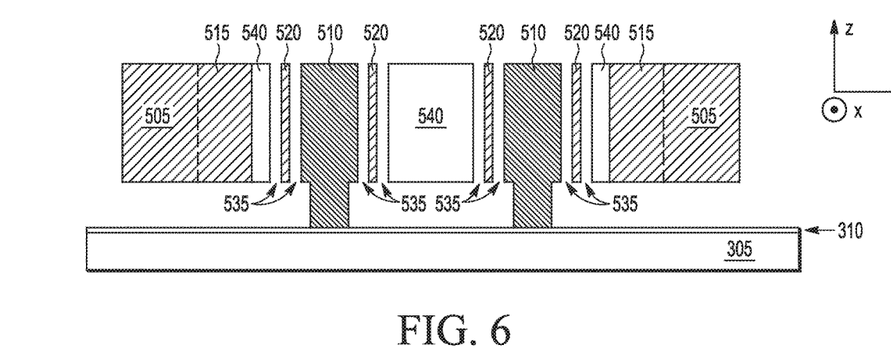

FIG. 6 illustrates a cross-sectional view diagram depicting the isolation anchor structure including isolation sub-frame structure 540 of MEMS device 500 of FIG. 5. The cross-sectional view of FIG. 6 is in a plane through the rotational axis in the y-direction, as defined by torsion springs 515. Device substrate 305 is covered with a dielectric layer 310 that insulates MEMS device 500 from any underlying circuitry. Anchors 510 are attached to the top surface of dielectric layer 310, which are spaced from one another in the y-direction. Openings 535 separate each anchor 510 from compliant structure 520, and compliant structure 520 from isolation sub-frame structure 540. Each end of isolation sub-frame structure 540 is connected to a respective torsion spring 515. Each respective torsion spring 515 is also connected to proof mass 505, where an interior edge of proof mass 505 (formed by opening 525) is shown as a dashed line.

Figure 7:
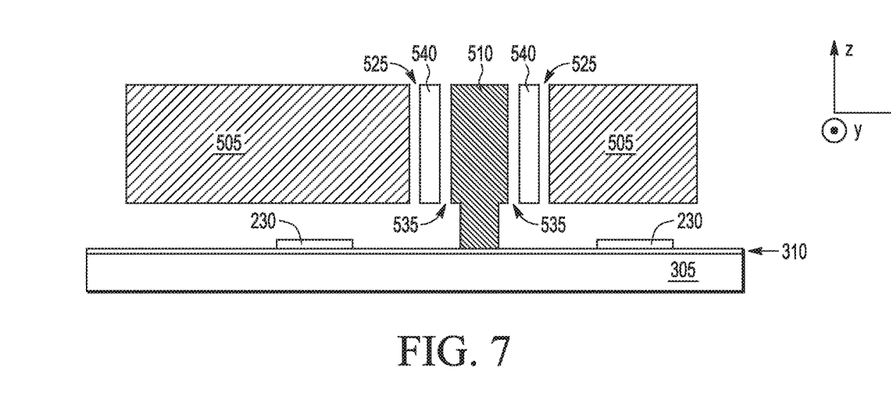

FIG. 7 illustrates a cross-sectional view diagram depicting the isolation anchor structure including isolation sub-frame structure 540 of MEMS device 500 of FIG. 2. The cross-sectional view of FIG. 7 is in a plane perpendicular to the rotational axis defined by torsion springs 515. Electrodes 230 are attached to the top surface of dielectric layer 310. In some embodiments, electrodes 230 are connected to other circuitry (not shown for ease of illustration). Anchors 510 are separated from isolation sub-frame structure 540 by openings 535. Isolation sub-frame structure 540 is separated from proof mass 505 by openings 525. Proof mass 505 is able to pivot around the rotational axis centered through anchor 510 (e.g., y-direction into the page), which is aligned with torsion springs 515 of MEMS device 500. Each electrode 230 is separated from proof mass 505 by a sense gap, where capacitances between electrodes 230 and proof mass 505 generally indicate acceleration.

Figure 8:
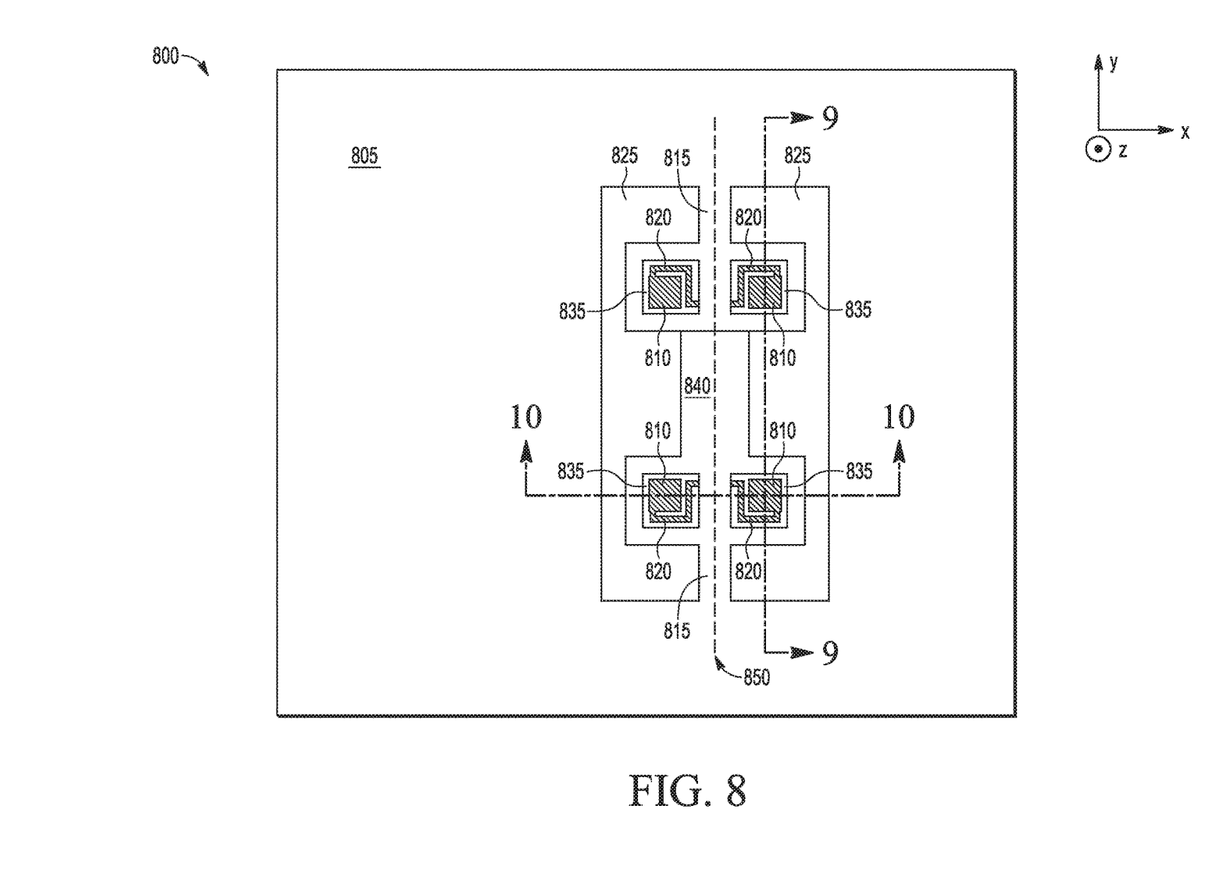
FIG. 8-10 illustrate block diagrams depicting another example isolation sub-frame structure for an example anchor structure of a MEMS device in which the disclosure is implemented, according to some embodiments.

FIG. 8 illustrates a top-down view diagram depicting an example isolation sub-frame structure for an example anchor structure of a MEMS device 800 in which the disclosure is implemented. MEMS device 800 includes proof mass 805, anchors 810, torsion springs 815, compliant structures 820, and isolation sub-frame structure 540. Proof mass 805 is suspended above an underlying substrate of MEMS device (also referred to as a device substrate) via anchors 810, compliant structures 820, isolation sub-frame structure 840, and torsion springs 815. MEMS device 800 also includes electrodes 230 (like those discussed above in connection with FIG. 2-4) attached to the device substrate that underlie proof mass 805 on either side of the rotational axis 850 defined by torsion springs 815, but are not shown in FIG. 8-10 for ease of illustration. Anchors 810, compliant structures 820, and isolation sub-frame structure 840 are separated from one another by one or more openings 835. Isolation sub-frame structure 840 and torsion springs 815 are separated from proof mass 805 by one or more openings 825, where isolation sub-frame structure 840, torsion springs 815, and compliant structures 820 are located interior to proof mass 805.

Figure 9:
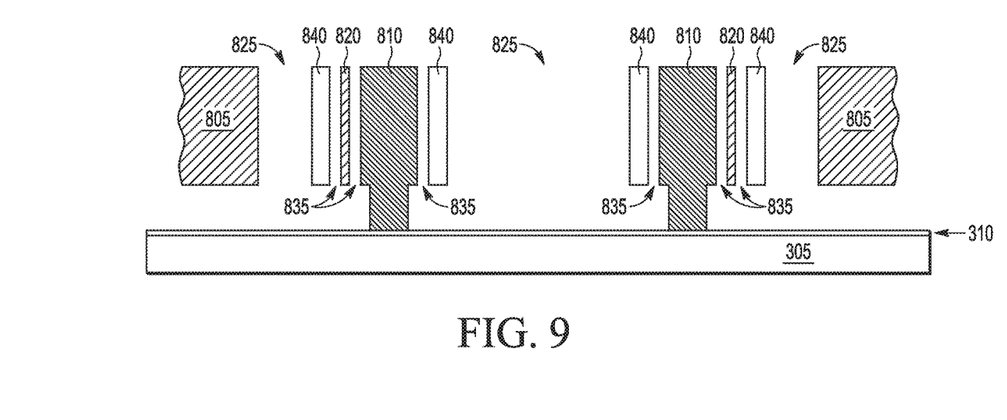

In the embodiment illustrated, the anchor structure of MEMS device 800 includes four separated anchors 810 attached to the device substrate, where the anchor structure is aligned with the rotational axis 850. Each anchor is positioned away from the center of proof mass 805 in both the x-direction and the y-direction. Anchors 810 may be characterized as two rows of anchors, with a row of anchors on either side of the rotational axis 850. Each row of anchors is aligned with a line that is parallel to the rotational axis and is offset from the rotational axis by some distance in the x-direction, where broken line 9 also illustrates such a parallel and offset line. A different number and arrangement of anchors 810 may be implemented in other embodiments (e.g., alternating or "zig zag" arrangement of anchors, multiple rows of separated anchors, three or more separated anchors in a row, and the like), where such anchors are arranged to support pivoting of proof mass 805 about rotational axis 850, such as being aligned with a line parallel to, and offset from, the rotational axis. It is noted that the rotational axis 850 centered through torsion springs 815 is also centered through isolation sub-frame structure 840 in the y-direction. It is also noted that since the anchors are also separated from one another in the x-direction, the anchors experience strain buildup in both the y-direction and in the x-direction.

Isolation sub-frame structure 840 surrounds all anchors 810, with a portion of each anchor 810 being located interior to isolation sub-frame structure 840. Each anchor 810 is connected to isolation sub-frame structure 840 by a compliant structure 820, although a different number of compliant structures 820 may be attached in other embodiments. One end of each compliant structure 820 is connected to a portion of a respective anchor 810 and the other end of each compliant structure 820 is connected to an interior portion of isolation sub-frame structure 840. In the embodiment shown, each anchor 810 is surrounded by an opening 835 that generally spirals outward, although a different number of openings 835 and differently shaped openings 835 (which form differently shaped compliant structures 820) may be used in other embodiments. Isolation sub-frame structure 840 is connected between torsion springs 815, where an exterior portion of an end of isolation sub-frame structure 840 is connected to a respective torsion spring 815. Cross-sectional views of the isolation sub-frame structure 840 are illustrated in FIG. 9 (along broken line 9) and FIG. 10 (along broken line 10).

FIG. 9 illustrates a cross-sectional view diagram depicting the isolation anchor structure including isolation sub-frame structure 840 of MEMS device 800 of FIG. 8. The cross-sectional view of FIG. 9 is in a plane parallel to and offset from the rotational axis in the y-direction, as defined by torsion springs 815. Device substrate 305 is covered with a dielectric layer 310 that insulates MEMS device 800 from any underlying circuitry. Anchors 810 are attached to the top surface of dielectric layer 310, which are spaced from one another in the y-direction. The anchors illustrated in FIG. 9 may be characterized as being on opposing ends of the isolation sub-frame structure 840. Openings 835 separate each anchor 810 from compliant structure 820 and isolation sub-frame structure 840. Openings 835 also separate compliant structure 820 from isolation sub-frame structure 840. Openings 825 separate isolation sub-frame structure 840 from proof mass 805, and also separate a portion of each opposing end of isolation sub-frame structure 840 from one another.

Figure 10:
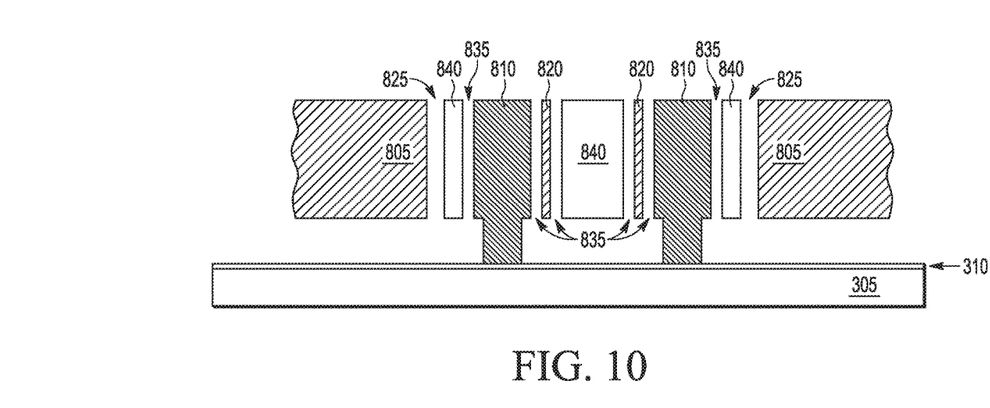

FIG. 10 illustrates a cross-sectional view diagram depicting the isolation anchor structure including isolation sub-frame structure 840 of MEMS device 800 of FIG. 8. The cross-sectional view of FIG. 10 is in a plane perpendicular to the rotational axis defined by torsion springs 815. The anchors illustrated in FIG. 10 may be characterized as being paired on a same end of the isolation sub-frame structure 840. Electrodes 230 (like those discussed above) are not shown for ease of illustration. Openings 835 separate each anchor 810 from compliant structure 820 and isolation sub-frame structure 840. Openings 835 also separate compliant structure 820 from isolation sub-frame structure 840. Openings 825 separate isolation sub-frame structure 840 from proof mass 805. Proof mass 805 is able to pivot around rotational axis through torsion springs 815, which is also centered through the portion of isolation sub-frame structure 840 between the illustrated anchors 810 (e.g., y-direction into the page).

FIG. 11-17 illustrate various steps of an example fabrication process for an example isolation anchor structure that includes an isolation sub-frame structure of a MEMS device. The fabrication process is simplified for ease of understanding. The components of the isolation anchor structure may be produced by utilizing current and upcoming micromachining techniques of depositing, patterning, etching, and the like. It should be further understood that the use of relational terms, if any, such as first and second, top and bottom, and the like are used to distinguish one from another entity or action without necessarily requiring or implying any actual such relationship or order between such entities or actions, unless otherwise stated. Additionally, other processes not discussed herein may be utilized to form other components of the MEMS device, such as the electrodes.

Figure 11:
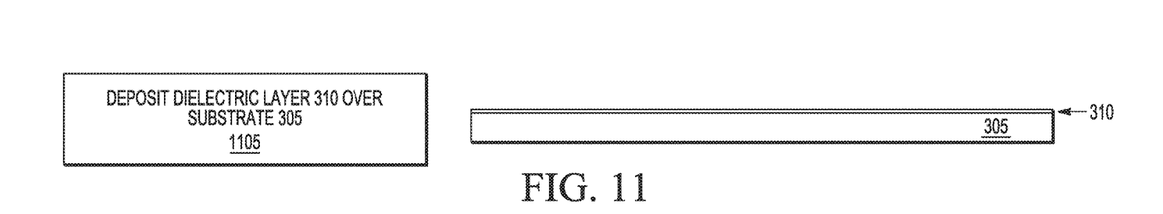
FIG. 11-17 illustrate various steps of an example fabrication process for an isolation sub-frame structure of a MEMS device in which the disclosure is implemented, according to some embodiments.

The process begins at operation 1105, where a dielectric layer 310 is deposited over a substrate 305. FIG. 11 illustrates the example MEMS device after completion of operation 1105. Substrate 305 may be implemented as a semiconductor substrate, which can be any semiconductor material or combinations of materials, such as gallium arsenide, silicon germanium, silicon-on-insulator (SOI), silicon, monocrystalline silicon, the like, and combinations of the above. Dielectric layer 310 is formed from a semiconductor material having suitable electrical insulating properties, such as silicon oxide, nitride, and the like. It is noted that deposition of the layers discussed herein may utilize one or more of a number of deposition processes including, but not limited to blanket deposition of a conformal layer of material over the device substrate using chemical vapor deposition (CVD), plasma enhanced chemical vapor deposition (PECVD), low pressure chemical vapor deposition (LPCVD), atomic layer deposition (ALD), physical vapor deposition (PVD), sputtering, evaporation, electrodeposition, epitaxy, growing a layer of material utilizing thermal oxidation, and the like.

Figure 12:
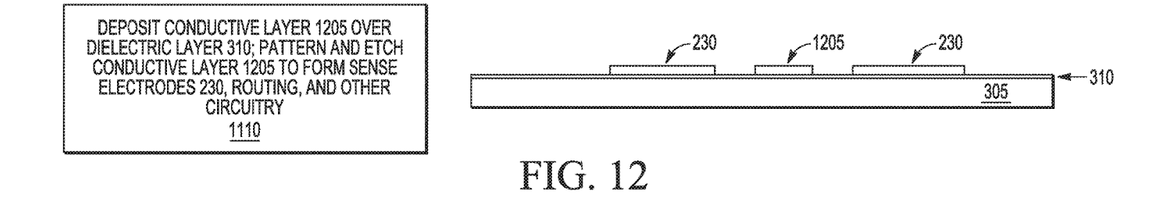

The process continues to operation 1110, where a conductive layer 1205 is deposited over dielectric layer 310. Conductive layer 1205 is formed from a conductive material having suitable conductivity properties for circuitry, such as copper, polysilicon, and the like. Conductive layer 1205 is then patterned and etched to form sense electrodes 230 and other circuitry such as routing circuitry. In some embodiments, the other circuitry includes a remaining portion of conductive layer 1205 is also patterned and etched, where the remaining portion is used as a connective pad for the anchor of the proof mass, where the connective pad may also be connected to other circuitry. FIG. 12 illustrates the example MEMS device after completion of operation 1110, including the remaining portion of conductive layer 1205 (or connective pad 1205). In other embodiments, such a pad is not formed and the anchor attaches to the top surface of dielectric layer 310 (e.g., the embodiments described above). It is noted that patterning and etching of the layers discussed herein may utilize one or more of a number of patterning and etching processes including, but not limited to photoresist or hard mask formation, wet etch, dry etch using reactive ion etch process, sputter etch, vapor phase etch, and the like. Any remaining etch mask or photoresist layers are stripped or removed.

Figure 13:
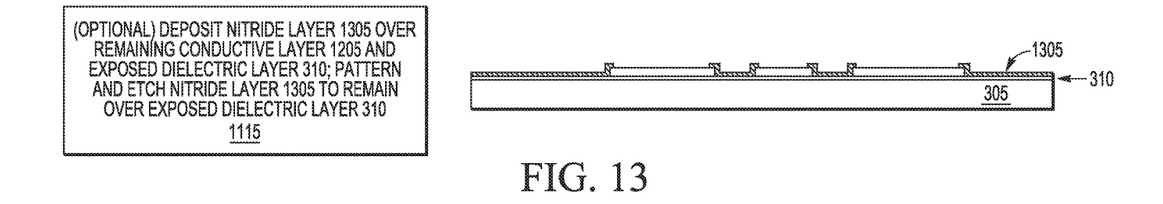

In some embodiments, the process continues to operation 1115, where a layer 1305 of nitride is deposited over the device substrate 305, including over any remaining portions of conductive layer 1205, which includes electrodes 230 and circuitry (and connective pads, if any), and over dielectric layer 310 that is exposed between the remaining portions of conductive layer 1205. Nitride layer 1305 is then patterned and etched to expose the remaining portions of conductive layer 1205, which includes electrodes 230 and circuitry (and connective pads, if any), through nitride layer 1305, while leaving portions of nitride layer 1305 that cover the exposed areas of dielectric layer 310 located between the electrodes 230 and circuitry (and connective pads, if any). FIG. 13 illustrates the example MEMS device after completion of optional operation 1115. In other embodiments, operation 1115 is omitted and the process continues to operation 1120.

Figure 14:
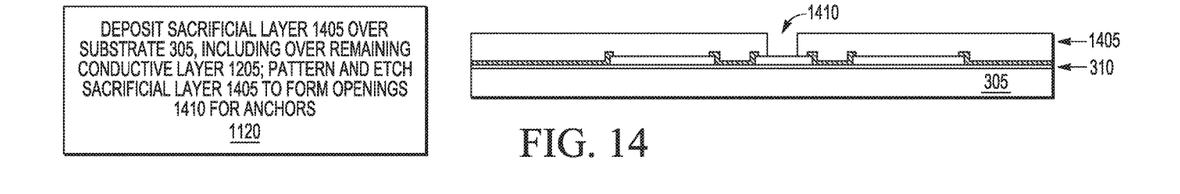

The process continues to operation 1120, where a sacrificial layer 1405 is deposited over substrate 305, including over any remaining portions of nitride layer 1305, any exposed portions of electrodes 230, and any exposed portions of remaining portion of layer 1205. Sacrificial layer 1405 is formed from a sacrificial material, such as silicon oxide, that is later removed (e.g., by etching) to release one or more structures of the MEMS device. Sacrificial layer 1405 is then patterned and etched to form an opening 1410 for each anchor. If connective pads are present, each opening is aligned with each connective pad. FIG. 14 illustrates the example MEMS device after completion of operation 1120.

Figure 15:
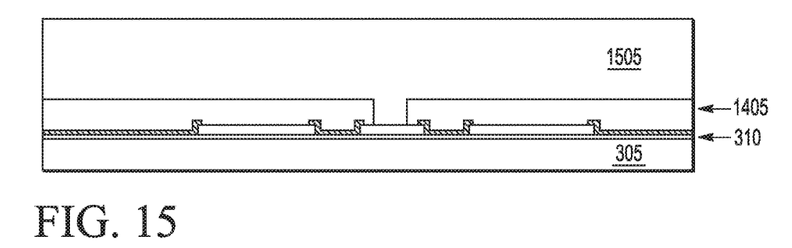

The process continues to operation 1125, where a structural layer 1505 is deposited over remaining portions of sacrificial layer 1405, including into openings 1410 to form the anchors. Structural layer 1505 includes one or more layers of a same material, such as polysilicon, single crystal silicon, and the like, that forms the structure of the MEMS device. The structural material has suitable capacitive properties for use with electrodes 230 (e.g., capacitance between a proof mass and an underlying electrode 230 is utilized in determining acceleration). FIG. 15 illustrates the example MEMS device after completion of operation 1125.

Figure 16:
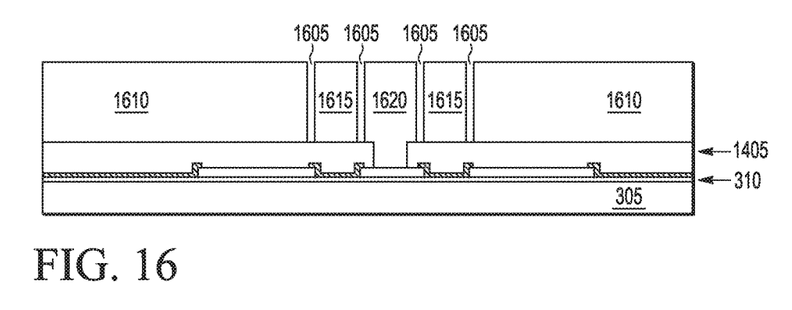

The process continues to operation 1130, where the structural layer 1505 is patterned and etched to form a number of openings 1605 that form a proof mass 1610, as well as a number of structures within proof mass 1610, including anchors 1620 and an isolation sub-frame structure 1615, as well as compliant structures and torsion springs. In some embodiments, openings 1605 also include perforations made in proof mass 1610. FIG. 16 illustrates the example MEMS device after completion of operation 1130.

Figure 17:
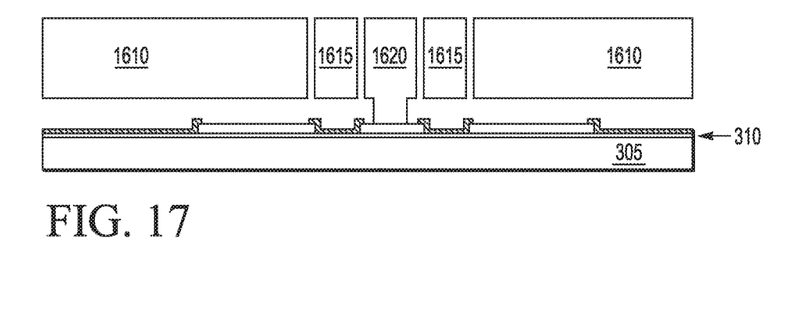

The process continues to operation 1135, where the sacrificial layer 1405 is selectively removed (e.g., etching) to release proof mass 1610. In embodiments where the proof mass includes perforations, the perforations help ensure that enough of the etchant (e.g., wet etch or dry etch) reaches the sacrificial layer 1405 underlying the proof mass to remove the sacrificial material to successfully release the proof mass. The process then ends. FIG. 17 illustrates the example MEMS device after completion of operation 1135.

By now it should be appreciated that there has been provided an isolation sub-frame structure for a MEMS device anchor structure having two or more separated anchor points, where in-plane movements arising from strain buildup between the separate anchor points due to substrate curvature are isolated by the isolation sub-frame structure and prevented from propagating to the torsion springs and proof mass of the MEMS device.

In one embodiment of the present disclosure, a microelectromechanical systems (MEMS) device is provided, the MEMS device including: a substrate; a proof mass positioned in space above a surface of the substrate, wherein the proof mass is configured to pivot on a rotational axis parallel to the substrate; an anchor structure including two or more separated anchors mounted to the surface of the substrate, wherein the anchor structure is aligned with the rotational axis; and an isolation sub-frame structure that surrounds the anchor structure and is flexibly connected to each of the two or more separated anchors of the anchor structure, where the proof mass is flexibly connected to the isolation sub-frame structure.

One aspect of the above embodiment provides that the isolation sub-frame structure is located interior to the proof mass, and the isolation sub-frame structure is separated from the proof mass by one or more openings.

Another aspect of the above embodiment provides that a portion of each of the two or more anchors are located interior to the isolation sub-frame structure, and the portion of each of the two or more anchors is separated from the isolation sub-frame structure by one or more openings.

Another aspect of the above embodiment provides that the MEMS device further includes: torsion springs configured to flexibly connect the proof mass to the isolation sub-frame structure, where the rotational axis is centered through the torsion springs.

Another aspect of the above embodiment provides that the MEMS device further includes: compliant structures configured to flexibly connect each anchor to the isolation sub-frame structure, where the compliant structures are separated from the isolation sub-frame structure by a plurality of openings.

A further aspect of the above embodiment provides that each anchor of the anchor structure is flexibly connected to a pair of compliant structures.

Another aspect of the above embodiment provides that each of the two or more separated anchors is aligned with the rotational axis.

Another aspect of the above embodiment provides that the two or more separated anchors includes at least two rows of separated anchors, and each row of the two or more separated anchors is aligned with a line parallel to and offset from the rotational axis.

Another aspect of the above embodiment provides that the MEMS device further includes: a pair of electrodes mounted on the surface of the substrate, where the electrodes underlie the proof mass on either side of the rotational axis.

In another embodiment of the present disclosure, a microelectromechanical systems (MEMS) device is provided, the MEMS device including: a substrate; and an isolation anchor structure mounted to the substrate and flexibly connected to a moveable structure positioned in space above a surface of the substrate, the isolation anchor structure including: two or more separated anchors mounted to the substrate, and an isolation sub-frame structure that surrounds the two or more separated anchors and is flexibly connected to the two or more separated anchors, where the two or more separated anchors experience strain buildup in at least one direction parallel to the surface of the substrate, and the isolation sub-frame structure is configured to isolate movement of the two or more separated anchors that arise due to the strain buildup from the moveable structure.

One aspect of the above embodiment provides that the isolation sub-frame structure is located interior to the moveable structure, and the isolation sub-frame structure is separated from the moveable structure by one or more openings.

Another aspect of the above embodiment provides that a portion of each of the two or more anchors are located interior to the isolation sub-frame structure, and the portion of each of the two or more anchors is separated from the isolation sub-frame structure by one or more openings.

Another aspect of the above embodiment provides that the two or more separated anchors includes at least four separated anchors separated from one another in two directions parallel to the surface of the substrate, and the at least four separated anchors are arranged to support rotation of the movable structure about a rotational axis.

In another embodiment of the present disclosure, a method of fabricating a microelectromechanical systems (MEMS) device is provided, the method including: depositing a sacrificial layer over a substrate; patterning and etching the sacrificial layer to form a plurality of openings in the sacrificial layer; depositing a structural layer over the substrate, including into the plurality of openings; patterning and etching the structural layer to form a plurality of structures including: a proof mass, an anchor structure including two or more separated anchors, and an isolation sub-frame; and removing the sacrificial layer to release the plurality of structures, where the isolation sub-frame structure surrounds the anchor structure and is flexibly connected to each of the two or more separated anchors, and the proof mass is flexibly connected to the isolation sub-frame structure.

One aspect of the above embodiment provides that the isolation sub-frame structure is located interior to the proof mass, and the isolation sub-frame structure is separated from the proof mass by one or more openings.

Another aspect of the above embodiment provides that a portion of each of the two or more anchors are located interior to the isolation sub-frame structure, and the portion of each of the two or more anchors is separated from the isolation sub-frame structure by one or more openings.

Another aspect of the above embodiment provides that the method further includes: prior to the depositing the sacrificial layer: depositing a conductive layer over the substrate, and patterning and etching the conductive layer to form electrodes and circuitry on the substrate, where the depositing the sacrificial layer over the substrate includes depositing the sacrificial layer over the electrodes and circuitry.

A further aspect of the above embodiment provides that the circuitry includes connective pads for the anchor structure, and the openings in the sacrificial layer are aligned with the connective pads.

Another further aspect of the above embodiment provides that the method further includes: prior to the depositing the sacrificial layer: depositing a nitride layer over the substrate, including over the electrodes and circuitry, and patterning and etching the nitride layer to form a remaining nitride layer, where the electrodes and circuitry are exposed through the remaining nitride layer, and the depositing the sacrificial layer over the substrate includes depositing the sacrificial layer over the remaining nitride layer.

Another aspect of the above embodiment provides that the method further includes: prior to the depositing the sacrificial layer: depositing a dielectric layer over the substrate, where the depositing the sacrificial layer over the substrate includes depositing the sacrificial layer over the dielectric layer.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Thus, it is to be understood that the configuration of devices and structures depicted herein are merely exemplary, and that in fact many other configurations can be implemented, which also mitigate stress on the MEMS device.

As used herein the terms "substantial" and "substantially" mean sufficient to accomplish the stated purpose in a practical manner and that minor imperfections, if any, are not significant for the stated purpose.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of fabricating a microelectromechanical systems (MEMS) device, the method comprising:
   depositing a sacrificial layer over a substrate;
   patterning and etching the sacrificial layer to form a plurality of openings in the sacrificial layer;
   depositing a structural layer over the substrate, including into the plurality of openings;
   patterning and etching the structural layer to form a plurality of structures comprising: a proof mass, an anchor structure comprising two or more separated anchors, and an isolation sub-frame; and
   removing the sacrificial layer to release the plurality of structures, wherein
      the isolation sub-frame structure surrounds the anchor structure and is flexibly connected to each of the two or more separated anchors, and
      the proof mass is flexibly connected to the isolation sub-frame structure.

2. The method of claim 1, wherein
the isolation sub-frame structure is located interior to the proof mass, and
the isolation sub-frame structure is separated from the proof mass by one or more openings.

3. The method of claim 1, wherein
a portion of each of the two or more anchors are located interior to the isolation sub-frame structure, and
the portion of each of the two or more anchors is separated from the isolation sub-frame structure by one or more openings.

4. The method of claim 1, further comprising:
prior to the depositing the sacrificial layer:
   depositing a conductive layer over the substrate, and
   patterning and etching the conductive layer to form electrodes and circuitry on the substrate, wherein the depositing the sacrificial layer over the substrate includes depositing the sacrificial layer over the electrodes and circuitry.

5. The method of claim 4, wherein
the circuitry comprises connective pads for the anchor structure, and
the openings in the sacrificial layer are aligned with the connective pads.

6. The method of claim 4, further comprising:
prior to the depositing the sacrificial layer:
   depositing a nitride layer over the substrate, including over the electrodes and circuitry, and
   patterning and etching the nitride layer to form a remaining nitride layer, wherein
      the electrodes and circuitry are exposed through the remaining nitride layer, and
      the depositing the sacrificial layer over the substrate includes depositing the sacrificial layer over the remaining nitride layer.

7. The method of claim 1, further comprising:
prior to the depositing the sacrificial layer:
   depositing a dielectric layer over the substrate, wherein the depositing the sacrificial layer over the substrate includes depositing the sacrificial layer over the dielectric layer.

8. The method of claim 1, wherein
the proof mass is configured to pivot on a rotational axis parallel to the substrate, and
the anchor structure is aligned with the rotational axis.

9. The method of claim 8, wherein
the plurality of structures further comprises torsion springs that flexibly connect the proof mass to the isolation sub-frame structure, and
the torsion springs are centered through the rotational axis.

10. The method of claim 1, wherein
the plurality of structures further comprises compliant structures that flexibly connect each anchor to the isolation sub-frame structure, wherein the compliant structures are separated from the isolation sub-frame structure by a plurality of openings.

11. The method of claim 10, wherein
each anchor of the anchor structure is flexibly connected to a pair of compliant structures.

12. The method of claim 8, wherein
each of the two or more separated anchors is aligned with the rotational axis.

13. The method of claim 8, wherein
the two or more separated anchors comprise at least two rows of separated anchors, and
each row of the two or more separated anchors is aligned with a line parallel to and offset from the rotational axis.

14. The method of claim 8, further comprising:
a pair of electrodes mounted on the surface of the substrate, wherein the electrodes underlie the proof mass on either side of the rotational axis.

\* \* \* \* \*